(12) United States Patent
Cheng et al.

(10) Patent No.: US 9,385,742 B1
(45) Date of Patent: Jul. 5, 2016

(54) WIDEBAND MULTI-MODE CURRENT SWITCH FOR DIGITAL TO ANALOG CONVERTER

(71) Applicant: RAYTHEON COMPANY, Waltham, MA (US)

(72) Inventors: William W. Cheng, Redondo Beach, CA (US); Michael H. Liou, Granada Hills, CA (US)

(73) Assignee: RAYTHEON COMPANY, Waltham, MA (US)

(*) Notice: Subject to any disclaimer, the term of this patent is extended or adjusted under 35 U.S.C. 154(b) by 0 days.

(21) Appl. No.: 14/942,723

(22) Filed: Nov. 16, 2015

(51) Int. Cl.
*H03M 1/66* (2006.01)

(52) U.S. Cl.
CPC ..................... *H03M 1/66* (2013.01)

(58) Field of Classification Search
CPC ............. H03M 1/66; H03M 1/46; H03M 3/50
USPC .......................... 341/144, 145, 136
See application file for complete search history.

(56) References Cited

U.S. PATENT DOCUMENTS

| | | | |
|---|---|---|---|
| 6,061,010 A | 5/2000 | Adams et al. | |
| 6,476,748 B1 | 11/2002 | Galton | |
| 6,563,447 B1* | 5/2003 | Schofield | H03K 17/04106 341/136 |
| 6,628,220 B2 | 9/2003 | Cosand | |
| 6,778,116 B1 | 8/2004 | Skones et al. | |
| 6,977,602 B1 | 12/2005 | Ostrem et al. | |
| 7,042,379 B2 | 5/2006 | Choe | |
| 7,064,695 B2* | 6/2006 | Koo | H03K 17/04106 341/136 |
| 7,307,568 B1 | 12/2007 | Nhuyen et al. | |
| 7,675,450 B1* | 3/2010 | Tabatabaei | H03M 1/682 341/144 |
| 8,031,098 B1 | 10/2011 | Ebner et al. | |
| 8,085,178 B2 | 12/2011 | Turner et al. | |
| 8,791,849 B1 | 7/2014 | Marr et al. | |
| 9,041,577 B2 | 5/2015 | Bore et al. | |
| 2006/0192590 A1* | 8/2006 | Koo | H03K 17/04106 326/122 |
| 2011/0205097 A1* | 8/2011 | Asayama | H03M 1/0863 341/145 |
| 2013/0214953 A1* | 8/2013 | Shiraishi | H03M 1/0845 341/144 |

OTHER PUBLICATIONS

Chen et al., "Multi-Mode Sub-Nyquist Rate Digital-To-Analog Conversion for Direct Waveform Synthesis," IEEE, SiPS, pp. 112-117, 2008.
Chen et al., "A 10b 600 Ms/s Multi-mode CMOS DAC for Multiple Nyquist Zone Operation," Symposium on VLSI Circuits Digest of Technical Papers, pp. 66-67, 2011.

(Continued)

*Primary Examiner* — Jean B Jeanglaude
(74) *Attorney, Agent, or Firm* — Lewis Roca Rothgerber Christie LLP

(57) ABSTRACT

A current switching cell for a digital to analog converter. The switching cell includes three stages, a first control stage, a data stage, and a second control stage. The first control stage is configured to either disconnect the outputs of the digital to analog converter, or to connect them to the outputs of the data stage. The data stage is configured to operate in one of two states, depending on a data signal received, and the second control stage is configured to selectively invert the output of the digital to analog converter. The two control stages may be driven with several combinations of control waveforms to implement a non return to zero mode, a return to zero mode, inverse non return to zero mode, and inverse return to zero mode.

20 Claims, 10 Drawing Sheets

(56) References Cited

OTHER PUBLICATIONS

Choe et al., "A 1.6GS/s 12b Return-to-Zero GaAs RF DAC for Multiple Nyquist Operation," IEEE, International Solid-State Circuits Conference, 3 pages, 2005.

Poulton et al., "A 7.2-GSa/s, 14-bit or 12-GSa/s, 12-bit DAC in a 165-GHz $f_T$ BiCMOS Process," Symposium on VLSI Circuits Digest of Technical Papers, pp. 62-63, 2011.

Van de Sande et al., A 7.2 GSa/s, 14 Bit or 12 GSa/s. 12 Bit Signal Generator on a Chip in a 165 GHz $f_T$ BiCMOS Process, IEEE Journal of Solid-State Circuits, 47(4):1003-1012, Apr. 2012.

* cited by examiner

WIDEBAND MULTI-MODE CURRENT SWITCH FOR DIGITAL TO ANALOG CONVERTER

GOVERNMENT LICENSE RIGHTS

This invention was made with Government support. The Government has certain rights in the invention.

BACKGROUND

1. Field

One or more aspects of embodiments according to the present invention relate to digital to analog conversion, and more particularly to a system and method for generating wideband output signal from a digital to analog converter (DAC).

2. Description of Related Art

In applications using a digital to analog converter and requiring synthesized tones at frequencies that may be well above the sampling rate of the digital to analog converter, it may be desirable to use tones in the second Nyquist zone or in higher Nyquist zones. The power in such tones is attenuated by the sinc function of a conventional zeroth order hold DAC response beyond the first Nyquist zone and may therefore be too low to meet some requirements.

Thus, there is a need for a system and method for generating relatively high-power tones, from a digital to analog converter, in Nyquist zones above the first Nyquist zone.

SUMMARY

According to an embodiment of the present invention there is provided a digital to analog converter including: a current switching cell, the cell including: a first control stage having a first control input, first and second current inputs, and first and second current outputs, the first control stage being configured to: connect each current output of the first control stage to a respective current input of the first control stage when the first control input is in a first state, and disconnect each current output of the first control stage when the first control input is in a second state; a data stage having a data input, first and second current inputs, and first and second current outputs connected to respective current inputs of the first control stage, the data stage being configured to: connect the first and second current outputs of the data stage to the first and second current inputs of the data stage, respectively, when the data input is in a first state and, connect the first and second current outputs of the data stage to the second and first current inputs of the data stage, respectively, when the data input is in a second state; and a second control stage, having a second control input, a current input and first and second current outputs connected to respective current inputs of the data stage, the second control stage being configured to: connect the first current output of the second control stage to the current input of the second control stage when the second control input is in a first state, and connect the second current output of the second control stage to the current input of the second control stage when the second control input is in a second state.

In one embodiment, the first control stage includes a first transistor connected between the first current input of the first control stage and the first current output of the first control stage, and a second transistor connected between the second current input of the first control stage and the second current output of the first control stage.

In one embodiment, the first transistor is an n-channel metal-oxide semiconductor field effect transistor, a source of the first transistor being connected to the first current input of the first control stage and a drain of the first transistor being connected to the first current output of the first control stage.

In one embodiment, the data stage includes: a first differential pair having a tail, a first current output, and a second current output; and a second differential pair having a tail, a first current output, and a second current output, the first current output of the first differential pair and the first current output of the second differential pair being connected to the first current output of the data stage, the second current output of the first differential pair and the second current output of the second differential pair being connected to the second current output of the data stage, and the inputs of the first and second differential pairs being cross-coupled.

In one embodiment, the second control stage includes a differential pair.

In one embodiment, the digital to analog converter includes a resistor network connected to the current outputs of the first control stage.

In one embodiment, the digital to analog converter includes: a plurality of additional current switching cells; and a plurality of current references, each current reference being configured to source or sink a current having a first magnitude, each current reference being connected to a respective one of the current switching cell and the additional current switching cells.

In one embodiment, the digital to analog converter includes a resistor network connected to the current outputs of the first control stage, wherein the current switching cell and the additional current switching cell are connected to the resistor network.

In one embodiment, the resistor network includes: a first termination resistor connected between the first current output of the two current outputs of the first control stage and AC ground; and a second termination resistor connected between the second current output of the two current outputs of the first control stage and AC ground.

In one embodiment, the resistor network includes an R-2R ladder network.

In one embodiment, the digital to analog converter includes a control circuit having a clock input for receiving a periodic clock signal, a first control output connected to the first control input, and a second control output connected to the second control input, the control circuit being configured to operate in a first mode in which the control circuit: sets the first control input to the first state, and sets the second control input to the first state; the control circuit being further configured to operate in a second mode in which the control circuit: sets the first control input to the first state during one half of each cycle of the clock signal and to the second state during the remainder of each cycle of the clock signal, and sets the second control input to the first state; the control circuit being further configured to operate in a third mode in which the control circuit: sets the first control input to the first state, and sets the second control input to the first state during one half of each cycle of the clock signal and to the second state during the remainder of each cycle of the clock signal; and the control circuit being further configured to operate in a fourth mode in which the control circuit: sets the first control input to the first state during a first portion of each cycle of the clock signal and to the second state during the remainder of each cycle of the clock signal, and sets the second control input to the first state during a first portion of the first portion of each cycle of the clock signal and to the second state during the remainder of the first portion of each cycle of the clock signal.

In one embodiment, the first portion of each cycle of the clock signal is the first one-half of each cycle of the clock signal.

In one embodiment, the first portion of the first portion of each cycle of the clock signal is the first one-half of the first portion of each cycle of the clock signal.

In one embodiment, the first portion of each cycle of the clock signal is the first two-thirds of each cycle of the clock signal.

In one embodiment, the first portion of the first portion of each cycle of the clock signal is the first one-half of the first portion of each cycle of the clock signal.

In one embodiment, the first control stage includes a first transistor connected between the first current input of the first control stage and the first current output of the first control stage, and a second transistor connected between the second current input of the first control stage and the second current output of the first control stage.

In one embodiment, the data stage includes: a first differential pair having a tail, a first current output, and a second current output; and a second differential pair having a tail, a first current output, and a second current output, the first current output of the first differential pair and the first current output of the second differential pair being connected to the first current output of the data stage, the second current output of the first differential pair and the second current output of the second differential pair being connected to the second current output of the data stage, and the inputs of the first and second differential pairs being cross-coupled.

In one embodiment, the digital to analog converter includes: a plurality of additional current switching cells; and a plurality of current references, each current reference being configured to source or sink a current having a first magnitude, each current reference being connected to a respective one of the current switching cell and the additional current switching cells.

In one embodiment, the digital to analog converter includes a resistor network connected to the current outputs of the first control stage, wherein the current switching cell and the additional current switching cell are connected to the resistor network.

In one embodiment, the resistor network includes: a first termination resistor connected between the first current output of the two current outputs of the first control stage and AC ground; and a second termination resistor connected between the second current output of the two current outputs of the first control stage and AC ground.

BRIEF DESCRIPTION OF THE DRAWINGS

Features, aspects, and embodiments are described in conjunction with the attached drawings, in which.

DETAILED DESCRIPTION

The detailed description set forth below in connection with the appended drawings is intended as a description of exemplary embodiments of a wideband multi-mode current switch for a digital to analog converter provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1:
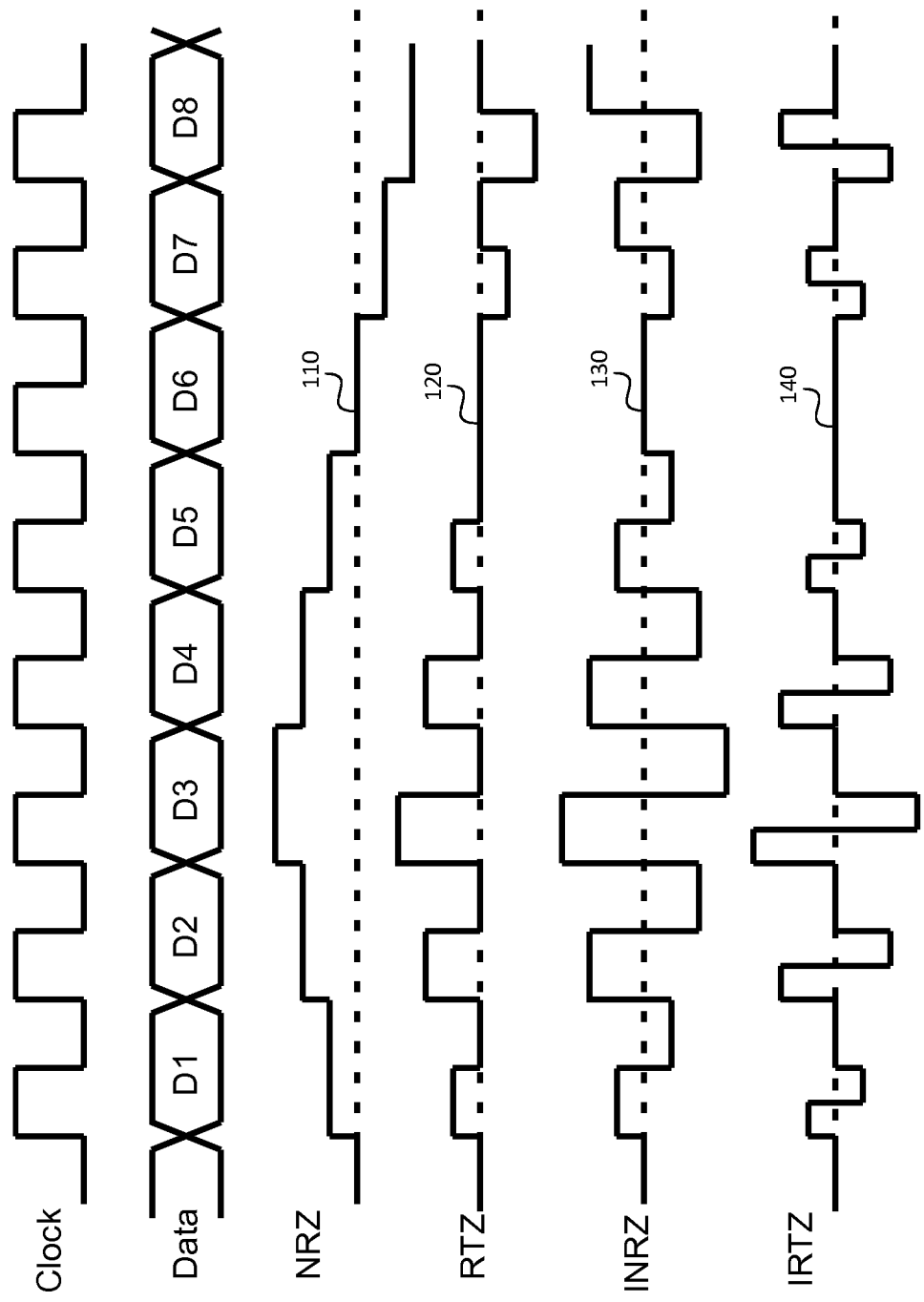
FIG. 1 is a waveform diagram showing four modes of operation of a digital to analog converter, according to an embodiment of the present invention.

Referring to FIG. 1, in one embodiment a digital to analog converter (DAC) is configured to generate an analog signal at an analog output in a non return to zero (NRZ) mode. In this mode the analog output is updated once every clock cycle, on the rising edge of the clock. If the sequence of digital data words provided to the DAC represents samples of a sine wave, then the analog output is a piecewise constant function 110 that approximates a sine wave as shown.

A DAC may have a clock or "sampling clock" input, a digital data input word, and an analog output. The signal at the analog output may be updated once per clock cycle of the sampling clock. Any frequency at the analog output of the DAC may fall into a Nyquist zone, each of which spans a frequency range equal to one half of the sampling clock frequency, or "sampling frequency". The first Nyquist zone is defined to be the frequency range from 0 (DC) to one-half of the sampling frequency, the second Nyquist zone is defined to be the frequency range from one-half of the sampling frequency to the sampling frequency, the third Nyquist zone is defined to be the frequency range from the sampling frequency to three-halves of the sampling frequency; further Nyquist zones are defined in an analogous manner, with the $n^{th}$ Nyquist zone extending from $(n-1)*f_s/2$ to $n*f_s/2$, where $f_s$ is the sampling frequency (which may also be referred to as $f_{ox}$). The analog output signal may have a component, referred to as the fundamental, in the first Nyquist zone, and other tones at other frequencies. The image in the second Nyquist zone, for example, is referred to as the first image, the image in the third Nyquist zone is referred to as the second image; in general the image in the $n^{th}$ Nyquist zone is referred to as the $(n-1)^{th}$ image. The maximum available frequency for the fundamental tone may be the Nyquist frequency, i.e., one-half of the sampling frequency. For applications in which a subsequent circuit (receiving the analog output of the DAC) requires an input signal at a higher frequency than the Nyquist frequency, a suitable Nyquist image may be used, instead of the fundamental, by the subsequent circuit.

Figure 2:
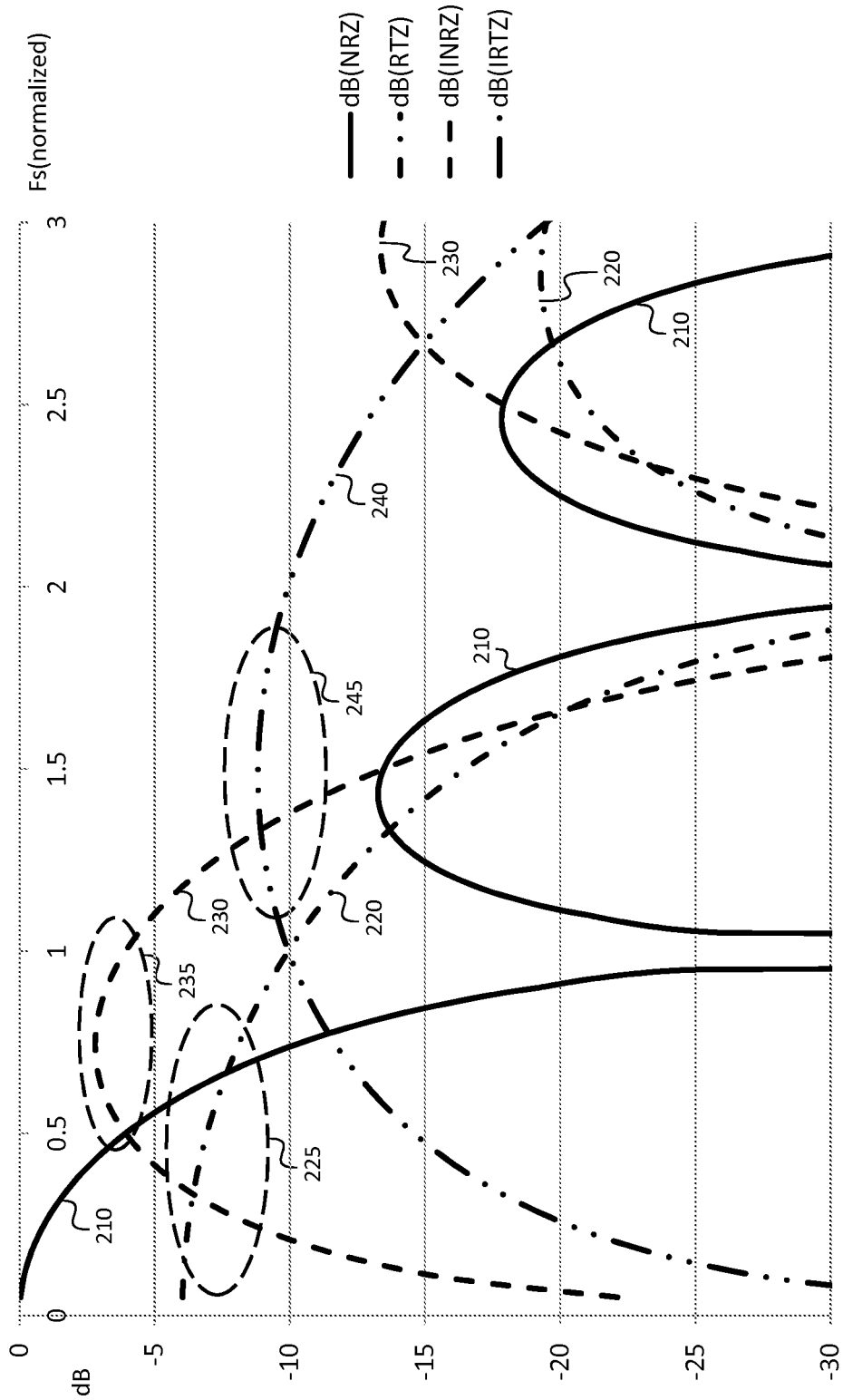
FIG. 2 is a graph of spectral envelopes for four modes of operation of a digital to analog converter according to an embodiment of the present invention.

Referring to FIG. 2, if the digital data stream supplied to the DAC consists of samples of a sine wave, the analog signal may have a spectrum consisting of a fundamental tone, and a plurality of images, all of which fall on an envelope 210 that is a sinc function of the sampling frequency.

For applications in which a Nyquist image is to be used, DAC output with a different envelope, e.g., an envelope providing more power to the Nyquist image to be used, may be generated by operating the DAC in another mode of several modes referred to herein as return to zero (RTZ) mode, inverse non return to zero (INRZ) mode, and inverse return to zero (IRTZ) mode.

Referring again to FIG. 1, in the RTZ mode, the analog signal at the analog output of the DAC is a piecewise constant function 120 equal the input data signal (e.g., a sine function) during half of each clock cycle, and equal to zero during the remainder of every clock cycle, as illustrated for the waveform 120 labeled "RTZ". The envelope function for this mode may be the RTZ envelope 220 of FIG. 2. In the INRZ mode, the analog signal at the analog output of the DAC is a piecewise constant function equal to the input data signal (e.g., the sine function) during half of each clock cycle, and equal to the opposite of the input data signal during the remainder of every clock cycle, as illustrated for the waveform 130 labeled "INRZ". The envelope function for this mode may be the INRZ envelope 230 of FIG. 2. In IRTZ mode, the analog signal at the analog output of the DAC is a piecewise constant function 140 equal to the input data signal (e.g., the sine function) during a first portion (e.g., one quarter) of each clock cycle, equal to the opposite of the input data signal during a second portion (e.g., one quarter) of each clock cycle, and equal to zero during a third portion (e.g., one half) of each clock cycle. The envelope function for this mode may be the IRTZ envelope 240 of FIG. 2. In one embodiment the RTZ, INRZ and IRTZ modes may each be selected when an output frequency is to be produced in a respective region of operation 225, 235, 245 shown in FIG. 2. This region of operation is where the output signal has the highest power level in the frequency spectrum according to the transfer function described in FIG. 2. In the NRZ conventional DAC mode, the signal power peaking at DC with nulls at n*Fs in 210 is where the DAC typically operating in the first Nyquist zone. In the RTZ DAC mode, the signal power also peaks at DC but with nulls at 2n*Fs in 220 is where the DAC typically operating in first or second Nyquist zones in region 225. In the INRZ DAC mode, the signal power peaking in the second Nyquist zone with nulls at m*Fs where m=0, 2, 4, . . . in 230 is where the DAC optimally operating in the second Nyquist zone in region 235. In the IRTZ DAC mode, the signal power peaks in the third Nyquist zone with nulls at m*Fs where m=0, 4, 8, . . . in 240 is where the DAC optimally operating in the third and fourth Nyquist zones in region 245. Note that changing the sampling clock or signal inversion duty cycle will slightly alter the shape of the corresponding transfer function but the general characteristic remains the same.

Figure 3:
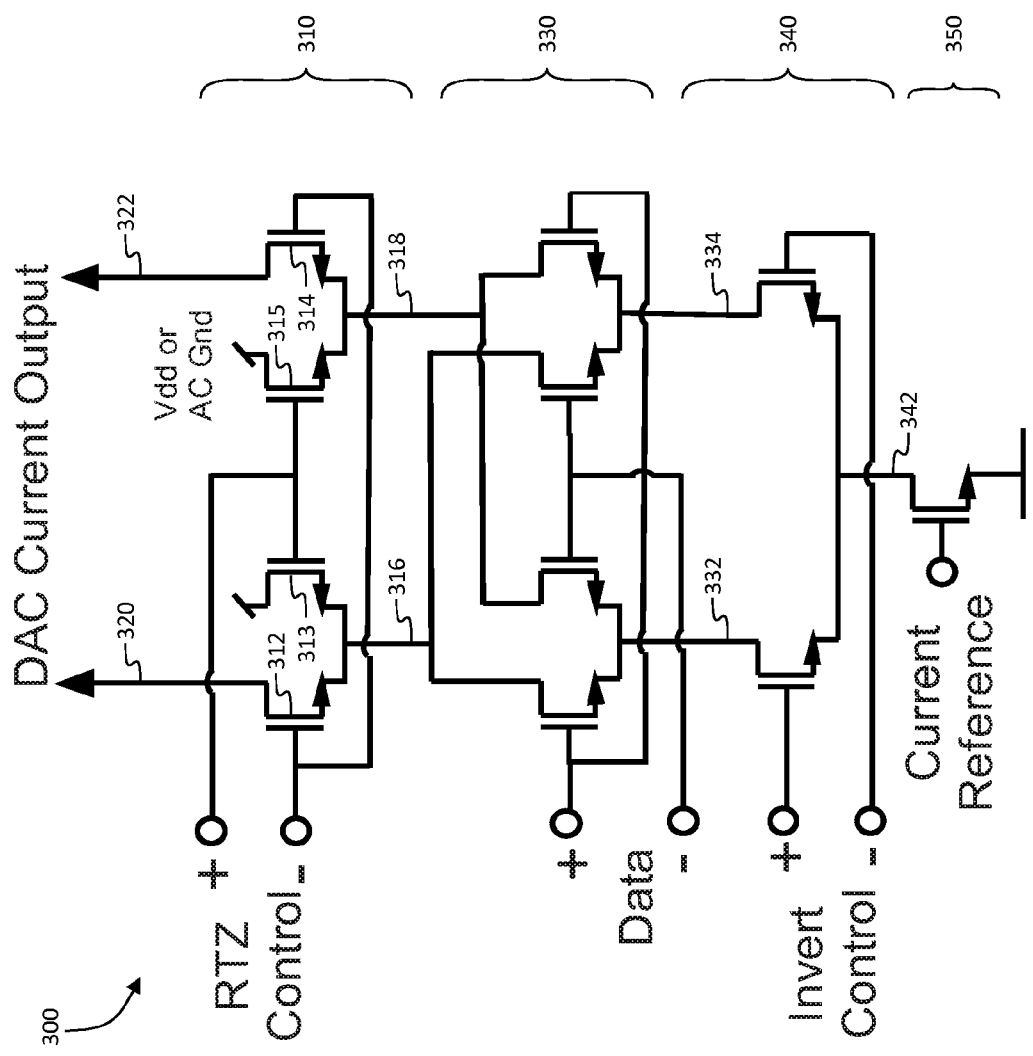
FIG. 3 is a schematic diagram of a switching cell for a digital to analog converter according to an embodiment of the present invention.

In one embodiment a DAC configured to operate in four modes, i.e., in an NRZ mode, an RTZ mode, an INRZ mode, and an IRTZ mode may be constructed from a plurality of DAC cells, each of which may be constructed according to the schematic of FIG. 3. In the circuit of FIG. 3, a first control stage referred to as the RTZ control stage 310 is configured to operate in either of two states. This stage includes two differential pairs, each including two transistors with a common connection referred to as the tail of the differential pair. For example, in FIG. 3, each differential pair consists of two n-channel metal-oxide semiconductor field effect transistors (MOSFETs), the sources of the MOSFETs being connected together to form the tail of the differential pair. The two differential pairs are current steering pairs with the inputs of each pair connected in opposite polarity controlled by the differential RTZ control signal. The transistor 312 on the left in the left differential pair and the transistor 314 on the right in the right differential pair are "output transistors" 312, 314 of the DAC cell, that are connected to respective current outputs 320, 322 of the DAC cell. The RTZ control stage 310 turns off both output transistors 312, 314 when the RTZ control input is high, and turns on both output transistors when the RTZ control input is low. When the output transistors are turned on, currents flowing at two current inputs 316, 318 are conducted by the output transistors 312, 314 to respective outputs 320, 322 of the DAC cell (which may be referred to, with reference to the circuit of FIG. 3, as the positive current output of the DAC cell and the negative current output of the DAC cell, respectively). The outputs 320, 322 of the DAC cell may represent a differential output, i.e., a current of a first magnitude flowing at the first output 320 may represent a positive output signal of a first magnitude, and the same current flowing instead at the second output 322 may represent a negative output signal of the same magnitude. When the output transistors 312, 314 are turned off, grounding transistors 313, 315 are turned on, and the currents flowing at the two current inputs 316, 318 are conducted by the output transistors 312, 314 to Vdd or AC ground. When the signal current is steered to AC ground instead of used at the signal output, the current is effectively forming the return to zero function.

A second stage of the DAC cell 300 referred to as the data stage 330 includes two cross-coupled differential pairs, each consisting of two n-channel MOSFETs. When the data signal is high, currents flowing at first and second current inputs 332, 334 of the data stage are conducted to respective first and second current outputs 316, 318 of the data stage (which are the current inputs 316, 318 of the RTZ control stage 310). When the data input signal is low, currents flowing at first and second current inputs 332, 334 of the data stage are conducted to respective second and first current outputs 316, 318 of the data stage. Thus, when the data input is low, the output of the DAC cell is inverted, relative to the output it would generate if the data input were high. The second data stage is constructed such that both the normal polarity of the signal current and the inverted polarity of the signal are available to be steered to the DAC output.

A second control stage of the DAC cell, referred to as an invert control stage 340, directs a current from a current input 342 to the first current input 332 of the data stage if its control input is high, or to the second current input 334 of the data stage if its control input is low. This control stage selects the normal polarity of the signal current and the inverted polarity of the signal current to be steer to the DAC output. The current input 342 may be connected to a current source or "current reference" 350, which sources or sinks a current of a substantially fixed magnitude.

Each of the RTZ control stage 310, the data stage 330, and the invert control stage 340 may have a differential input, which may be connected to two or more transistor gates in the respective stage as shown. Each such differential input may include two conductors referred to as a positive conductor and a negative conductor, or as carrying a positive signal and a negative signal. This terminology indicates the differential nature of the signals and does not imply, for example, that one conductor carries a positive voltage and the other carries a negative voltage. Each of the three stages as shown has one or more current inputs (at the bottom of the respective stage, as illustrated in the schematic diagram of FIG. 3) and two current outputs (at the top of the respective stage, as illustrated in the schematic diagram of FIG. 3). This terminology (of designating certain conductors as current inputs or outputs) does not indicate the direction of current flow, but rather the sequence in which the stages are connected together, between the current reference and the outputs 320, 322 of the DAC cell.

Figure 4:
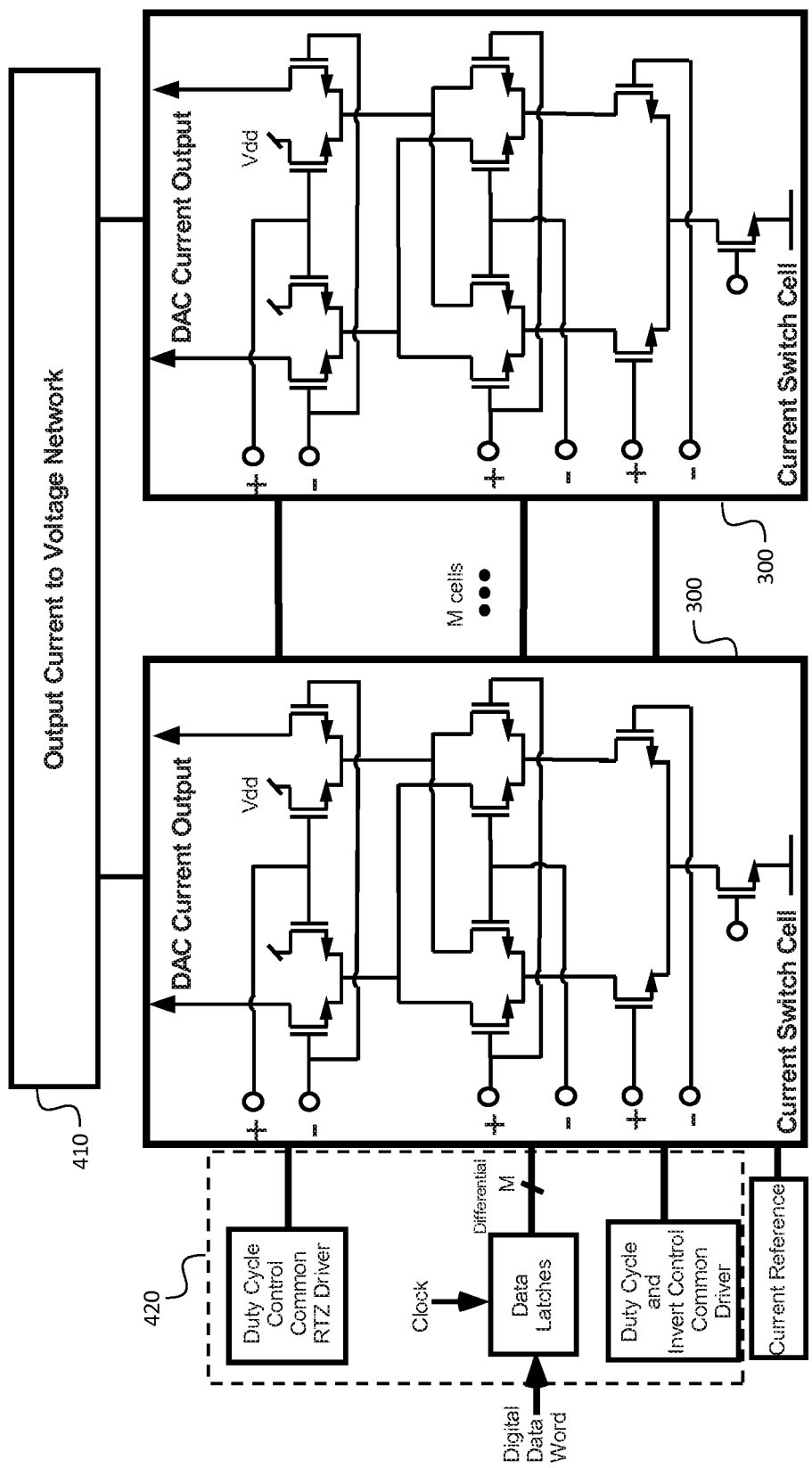
FIG. 4 is a block diagram of a digital to analog converter according to an embodiment of the present invention.

Multiple DAC cells may be combined as shown in FIG. 4. In embodiments in which all DAC cells switch substantially the same current, the output current to voltage network 410 may be a pair of termination resistors, or a R2R network. In the former case, the DAC cells may be configured to form a unary DAC (and driven by a parallel unary data signal), with, for example, at any point in time, the number of DAC cells with the positive output turned on being proportional to the analog signal at that point in time. In this case the positive outputs from all of the DAC cells may be connected together, so that their currents are summed, and the total current may flow through a first termination resistor, e.g., to Vdd or equivalent AC ground. The negative outputs from all of the DAC cells may be also be connected together, so that their currents are summed, and the total current may flow through a second termination resistor to AC ground (e.g., to ground or to Vdd). The negative and positive outputs of the DAC cells may also be connected to respective terminals of a differential amplifier, so that the difference between voltages generated across the two termination resistors generates the output voltage at the output of the differential amplifier.

In another embodiment the DAC cells may be configured to form a binary DAC and driven with a binary data signal. In such an embodiment the output current to voltage network 410 may include two R2R resistor networks. The positive outputs of the DAC cells may be connected to a first R2R resistor network, the voltage at the output of which is a weighted sum of the DAC cell output currents, with the weights being a geometric progression with a ratio of 2. The negative outputs of the DAC cells may similarly be connected to a second R2R resistor network.

In another embodiment in which DAC cells may be configured to form a binary DAC and be driven with a binary data signal, the current sources of the DAC cells may provide different amounts of current, the current magnitudes forming a geometric progression with a ratio of 2 (i.e., each current source providing half as much current or twice as much current as another current source). In this embodiment the current to voltage network 410 may be a pair of termination resistors connected between (i) the two respective common nodes at which the pairs of conductors of the differential DAC current outputs are connected together, and (ii) AC ground.

In some embodiments these configurations may be combined. For example, a 12-bit compound DAC may be formed by 32 DAC cells configured as a 5-bit unary DAC, combined with 7 DAC cells configured as a 7-bit binary DAC. The 7 bit binary DAC may provide the most significant 7 bits of the compound DAC or the least significant 7 bits of the compound DAC.

A control circuit 420 may supply a differential RTZ control signal, a differential data signal, and a differential invert control signal to each of the DAC cells. The control circuit may be configurable, e.g., by a system-level controller, to operate in any of the four modes (NRZ, RTZ, INRZ, or IRTZ), or in a variant of IRTZ with a duty cycle different from 50%, discussed in further detail below.

Figure 5:
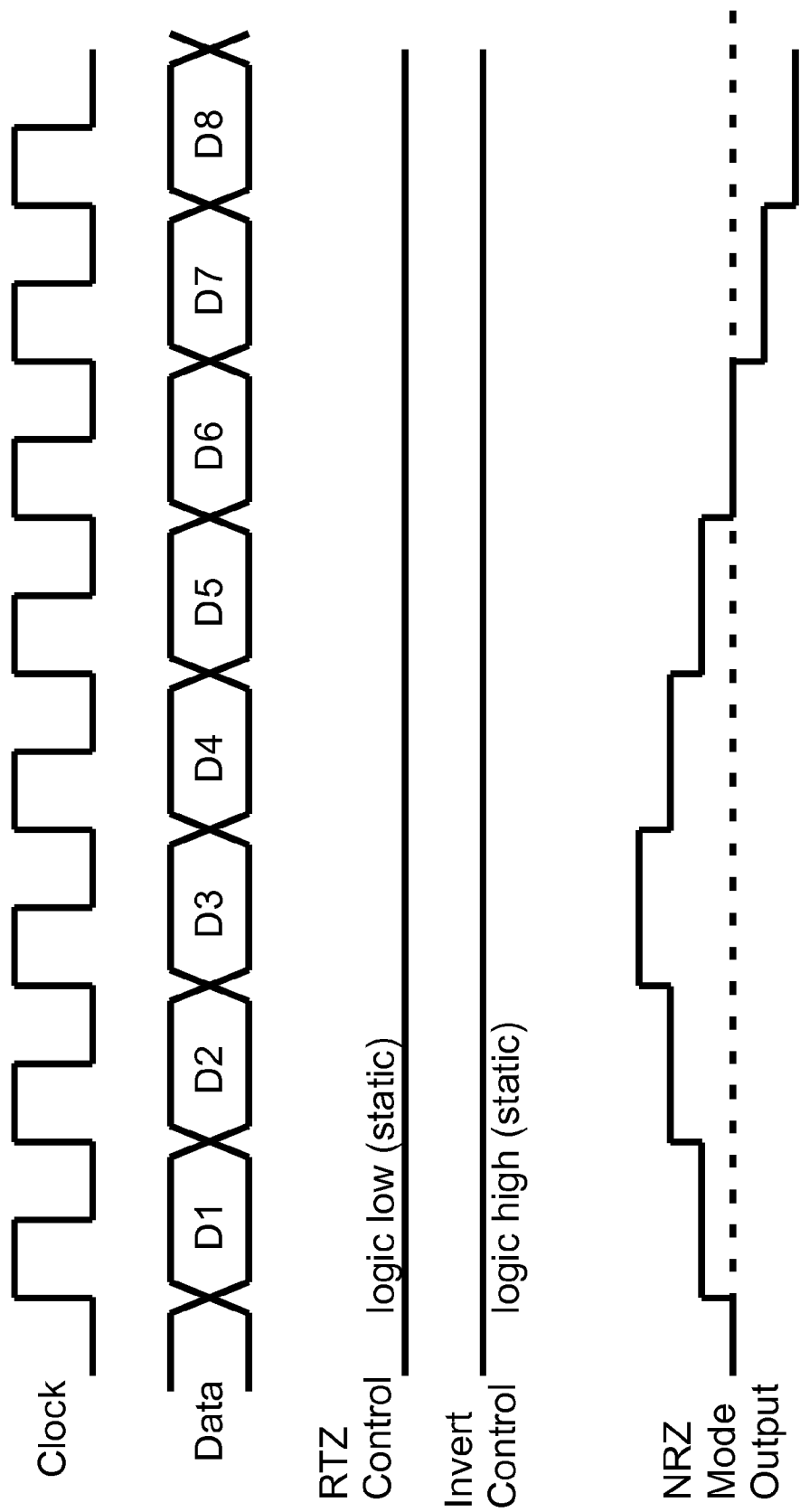
FIG. 5 is a waveform diagram showing a first mode of operation of a digital to analog converter, according to an embodiment of the present invention.
Figure 6:
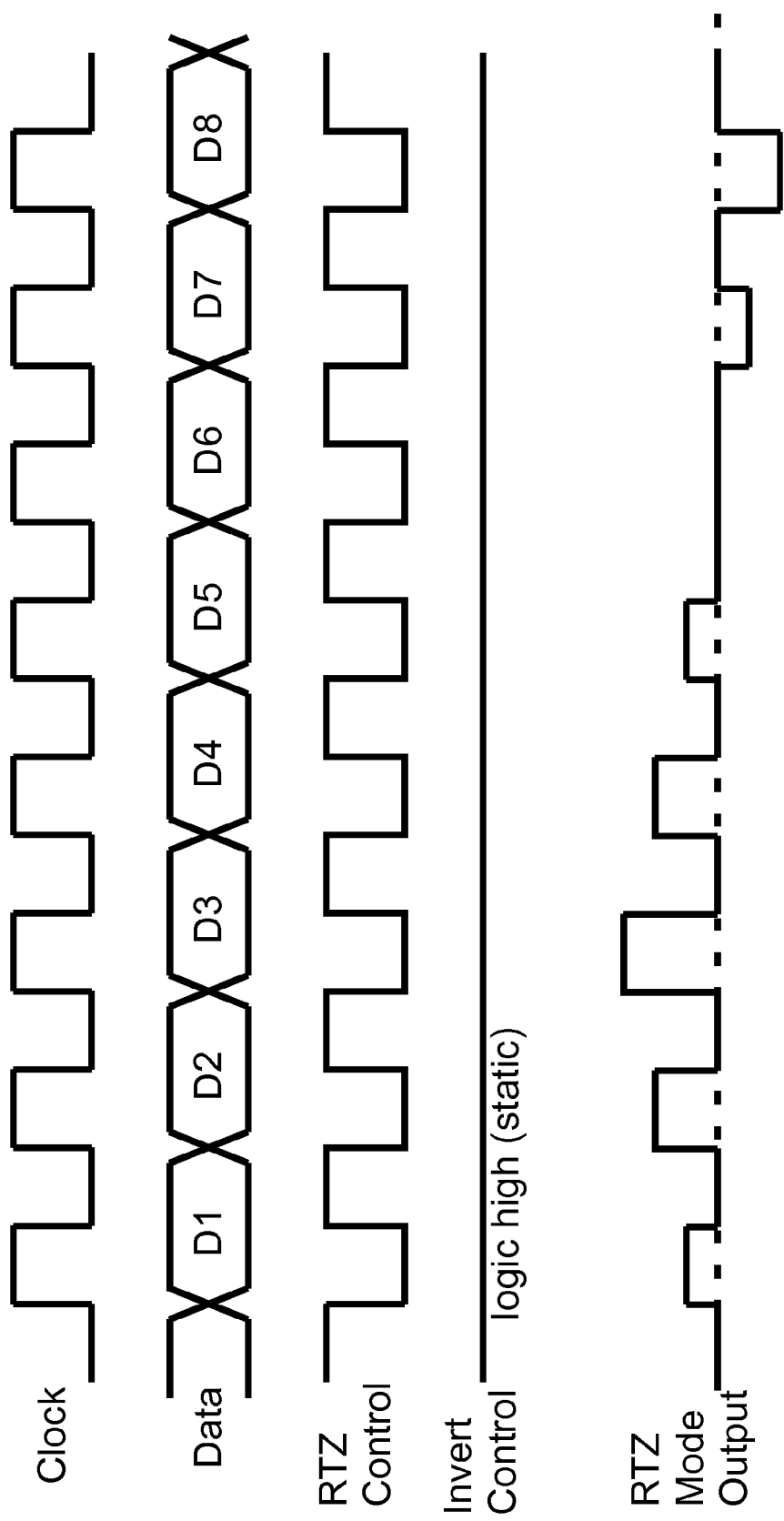
FIG. 6 is a waveform diagram showing a second mode of operation of a digital to analog converter, according to an embodiment of the present invention.
Figure 7:
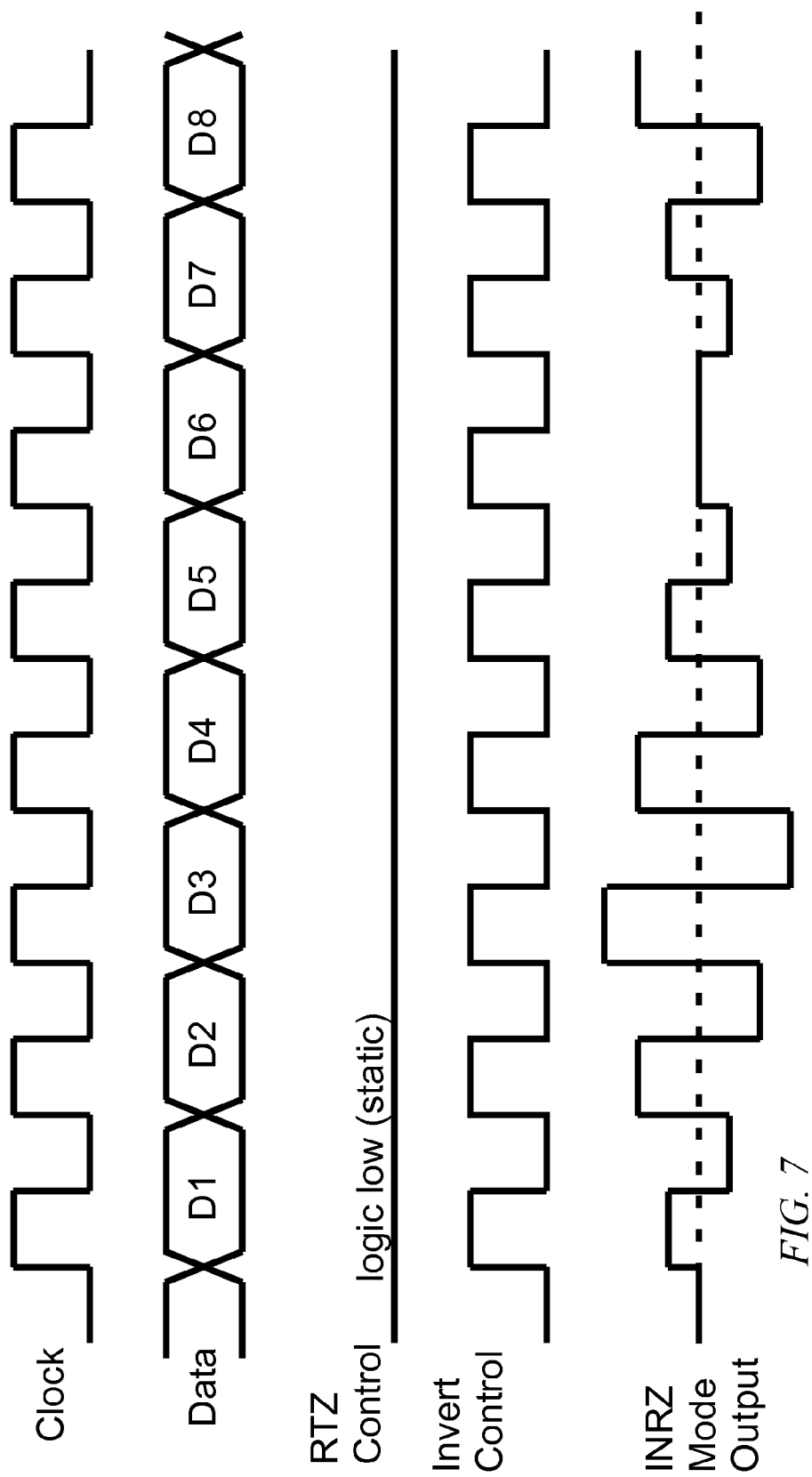
FIG. 7 is a waveform diagram showing a third mode of operation of a digital to analog converter, according to an embodiment of the present invention.
Figure 8:
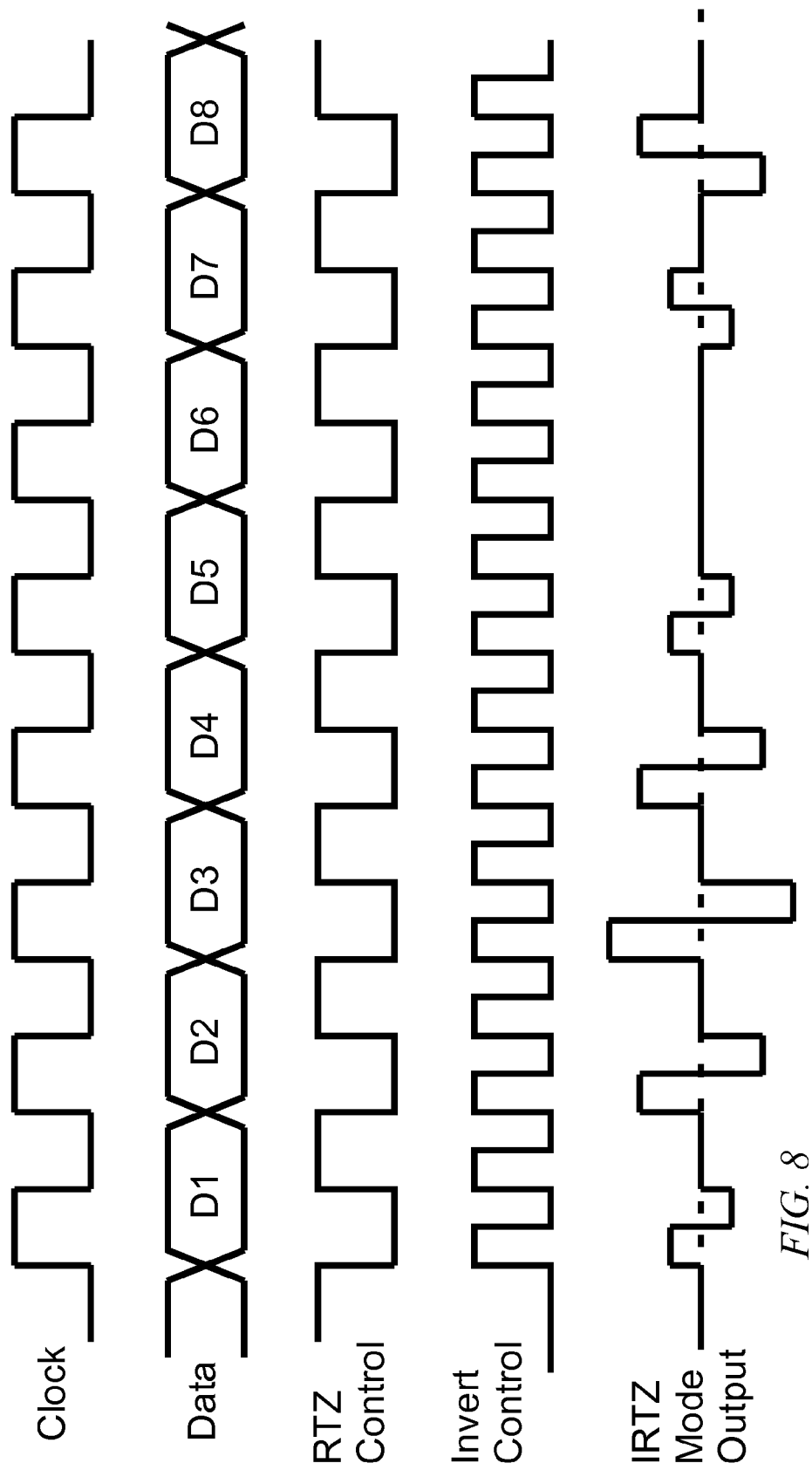
FIG. 8 is a waveform diagram showing a fourth mode of operation of a digital to analog converter, according to an embodiment of the present invention.

FIG. 5 shows control waveforms that may be used when the DAC is operating in NRZ mode. The RTZ control signal is constant, in the low state, and the invert control signal is constant in the high state. FIG. 6 shows control waveforms that may be used when the DAC is operating in RTZ mode. The RTZ control signal alternates between low and high at the same rate as the clock, and the invert control signal is constant in the high state. FIG. 7 shows control waveforms that may be used when the DAC is operating in INRZ mode. The RTZ control signal is constant, in the low state, and the invert control signal alternates between low and high at the same rate as the clock. FIG. 8 shows control waveforms that may be used when the DAC is operating in IRTZ mode. The RTZ control signal alternates between low and high at the same rate as the clock, and the invert control signal alternates between low and high at twice the rate of the clock.

Figure 9:
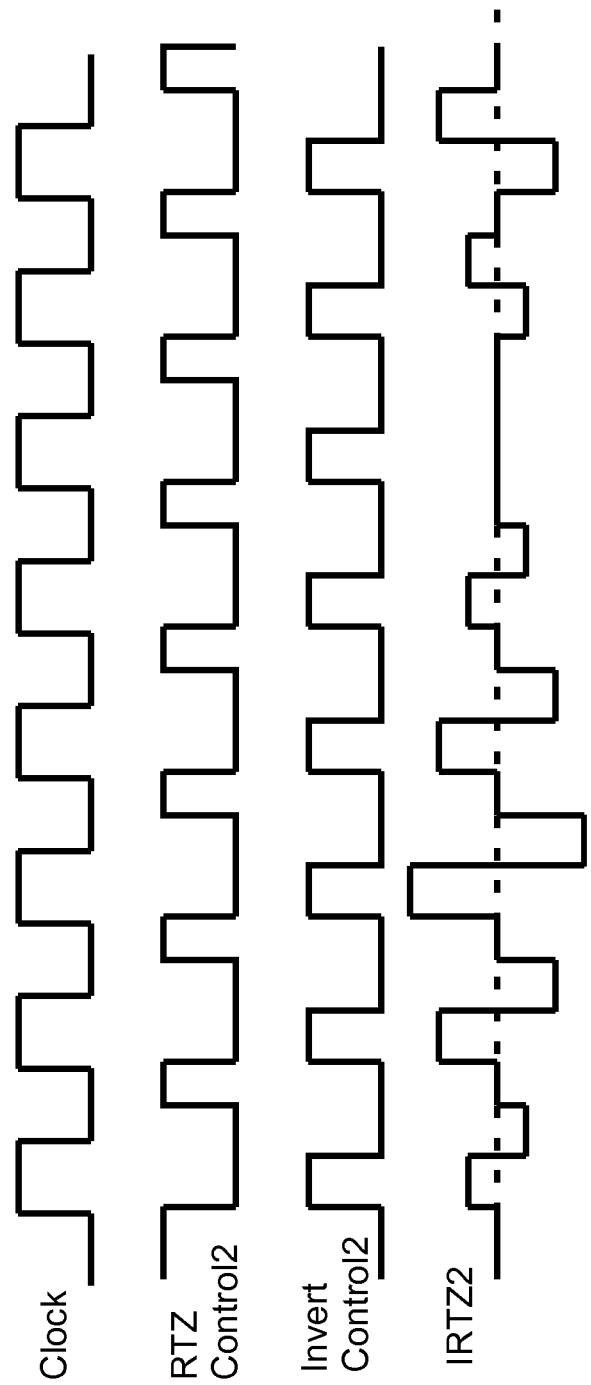
FIG. 9 is a waveform diagram showing a variant of the fourth mode of operation of FIG. 8, according to an embodiment of the present invention.

Referring to FIG. 9, in a modified-duty-cycle IRTZ mode, the RTZ control input is low for a part (e.g., the first ⅔) of the each clock cycle and high for the remainder of each clock cycle, and the invert control input is high for a part (e.g., the first ⅓) of the each clock cycle and low for the remainder of each clock cycle. The analog output waveform then is a piecewise constant function equal to the input data signal (e.g., the sine function) during a first portion of each clock cycle, equal to the opposite of the input data signal during a second portion of each clock cycle, and equal to zero during a third portion of each clock cycle. In the example of FIG. 9, each of the first portion, the second portion, and the third portion has a duration of one third of a clock cycle; in other embodiments the relative durations of the three portions may be adjusted arbitrarily by adjusting the waveforms at the RTZ control input and the invert control input accordingly. The use of this mode may improve the spurious-free dynamic range, or "spur-free dynamic range" of the DAC, by providing an increased settling time after each transition.

Figure 10:
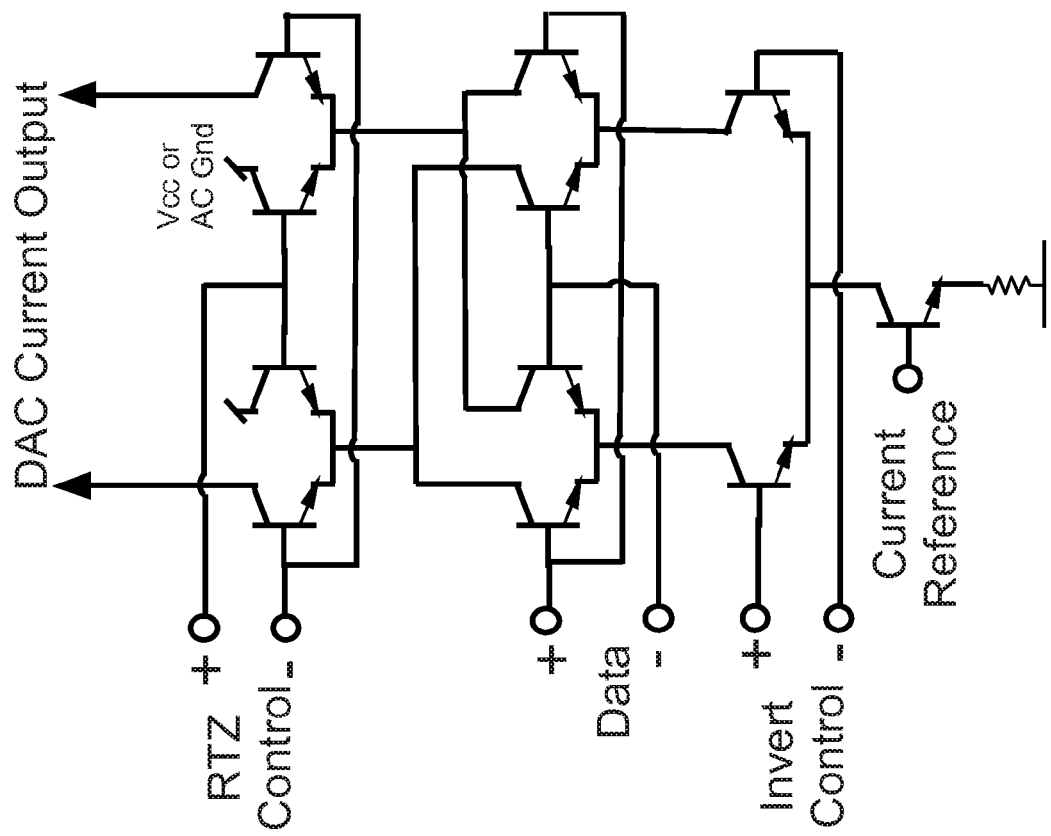
FIG. 10 is a schematic diagram of a switching cell for a digital to analog converter according to an embodiment of the present invention.

Although the circuit of FIG. 3 employs n-channel MOSFETs, in other embodiments other transistors, e.g., p-channel MOSFETs or bipolar junction transistors (BJTs) may be used instead of, or in combination with n-channel MOSFETs in any of the processing technologies such as Silicon, Silicon Germanium, GaAs, GaN, InP, etc. For example, FIG. 10 shows a DAC cell analogous to the cell illustrated in FIG. 3, constructed using NPN bipolar junction transistors.

Although limited embodiments of a wideband multi-mode current switch for digital to analog converter have been specifically described and illustrated herein, many modifications and variations will be apparent to those skilled in the art. Accordingly, it is to be understood that a wideband multi-mode current switch for digital to analog converter employed according to principles of this invention may be embodied other than as specifically described herein. The invention is also defined in the following claims, and equivalents thereof.

What is claimed is:

1. A digital to analog converter comprising:
 a current switching cell, the cell comprising:
  a first control stage having a first control input, first and second current inputs, and first and second current outputs, the first control stage being configured to:
   connect each current output of the first control stage to a respective current input of the first control stage when the first control input is in a first state, and
   disconnect each current output of the first control stage when the first control input is in a second state;

a data stage having a data input, first and second current inputs, and first and second current outputs connected to respective current inputs of the first control stage, the data stage being configured to:
  connect the first and second current outputs of the data stage to the first and second current inputs of the data stage, respectively, when the data input is in a first state and,
  connect the first and second current outputs of the data stage to the second and first current inputs of the data stage, respectively, when the data input is in a second state; and
a second control stage, having a second control input, a current input and first and second current outputs connected to respective current inputs of the data stage, the second control stage being configured to:
  connect the first current output of the second control stage to the current input of the second control stage when the second control input is in a first state, and
  connect the second current output of the second control stage to the current input of the second control stage when the second control input is in a second state.

2. The digital to analog converter of claim 1, wherein the first control stage comprises a first transistor connected between the first current input of the first control stage and the first current output of the first control stage, and a second transistor connected between the second current input of the first control stage and the second current output of the first control stage.

3. The digital to analog converter of claim 2, wherein the first transistor is an n-channel metal-oxide semiconductor field effect transistor, a source of the first transistor being connected to the first current input of the first control stage and a drain of the first transistor being connected to the first current output of the first control stage.

4. The digital to analog converter of claim 1, wherein the data stage comprises:
  a first differential pair having a tail, a first current output, and a second current output; and
  a second differential pair having a tail, a first current output, and a second current output,
  the first current output of the first differential pair and the first current output of the second differential pair being connected to the first current output of the data stage,
  the second current output of the first differential pair and the second current output of the second differential pair being connected to the second current output of the data stage, and
  the inputs of the first and second differential pairs being cross-coupled.

5. The digital to analog converter of claim 1, wherein the second control stage comprises a differential pair.

6. The digital to analog converter of claim 1, further comprising a resistor network connected to the current outputs of the first control stage.

7. The digital to analog converter of claim 1, further comprising:
  a plurality of additional current switching cells; and
  a plurality of current references, each current reference being configured to source or sink a current having a first magnitude, each current reference being connected to a respective one of the current switching cell and the additional current switching cells.

8. The digital to analog converter of claim 7 further comprising a resistor network connected to the current outputs of the first control stage, wherein the current switching cell and the additional current switching cell are connected to the resistor network.

9. The digital to analog converter of claim 8, wherein the resistor network comprises:
  a first termination resistor connected between the first current output of the two current outputs of the first control stage and AC ground; and
  a second termination resistor connected between the second current output of the two current outputs of the first control stage and AC ground.

10. The digital to analog converter of claim 8, wherein the resistor network comprises an R-2R ladder network.

11. The digital to analog converter of claim 1, further comprising a control circuit having a clock input for receiving a periodic clock signal, a first control output connected to the first control input, and a second control output connected to the second control input, the control circuit being configured to operate in a first mode in which the control circuit:
  sets the first control input to the first state, and
  sets the second control input to the first state;
  the control circuit being further configured to operate in a second mode in which the control circuit:
  sets the first control input to the first state during one half of each cycle of the clock signal and to the second state during the remainder of each cycle of the clock signal, and
  sets the second control input to the first state;
  the control circuit being further configured to operate in a third mode in which the control circuit:
  sets the first control input to the first state, and
  sets the second control input to the first state during one half of each cycle of the clock signal and to the second state during the remainder of each cycle of the clock signal; and
  the control circuit being further configured to operate in a fourth mode in which the control circuit:
  sets the first control input to the first state during a first portion of each cycle of the clock signal and to the second state during the remainder of each cycle of the clock signal, and
  sets the second control input to the first state during a first portion of the first portion of each cycle of the clock signal and to the second state during the remainder of the first portion of each cycle of the clock signal.

12. The digital to analog converter of claim 11, wherein the first portion of each cycle of the clock signal is the first one-half of each cycle of the clock signal.

13. The digital to analog converter of claim 12, wherein the first portion of the first portion of each cycle of the clock signal is the first one-half of the first portion of each cycle of the clock signal.

14. The digital to analog converter of claim 11, wherein the first portion of each cycle of the clock signal is the first two-thirds of each cycle of the clock signal.

15. The digital to analog converter of claim 14, wherein the first portion of the first portion of each cycle of the clock signal is the first one-half of the first portion of each cycle of the clock signal.

16. The digital to analog converter of claim 11, wherein the first control stage comprises a first transistor connected between the first current input of the first control stage and the first current output of the first control stage, and a second transistor connected between the second current input of the first control stage and the second current output of the first control stage.

17. The digital to analog converter of claim 11, wherein the data stage comprises:

a first differential pair having a tail, a first current output, and a second current output; and a second differential pair having a tail, a first current output, and a second current output, the first current output of the first differential pair and the first current output of the second differential pair being connected to the first current output of the data stage, the second current output of the first differential pair and the second current output of the second differential pair being connected to the second current output of the data stage, and the inputs of the first and second differential pairs being cross-coupled.

18. The digital to analog converter of claim 11, further comprising:

a plurality of additional current switching cells; and a plurality of current references, each current reference being configured to source or sink a current having a first magnitude, each current reference being connected to a respective one of the current switching cell and the additional current switching cells.

19. The digital to analog converter of claim 18 further comprising a resistor network connected to the current outputs of the first control stage, wherein the current switching cell and the additional current switching cell are connected to the resistor network.

20. The digital to analog converter of claim 19, wherein the resistor network comprises:

a first termination resistor connected between the first current output of the two current outputs of the first control stage and AC ground; and a second termination resistor connected between the second current output of the two current outputs of the first control stage and AC ground.

* * * * *